(12) United States Patent
Yoshimi et al.

(10) Patent No.: US 6,190,932 B1
(45) Date of Patent: Feb. 20, 2001

(54) METHOD OF MANUFACTURING TANDEM TYPE THIN FILM PHOTOELECTRIC CONVERSION DEVICE

(75) Inventors: Masashi Yoshimi, Kobe; Yoshifumi Okamoto, Otsu, both of (JP)

(73) Assignee: Kaneka Corporation, Osaka (JP)

( * ) Notice: Under 35 U.S.C. 154(b), the term of this patent shall be extended for 0 days.

(21) Appl. No.: 09/389,514

(22) Filed: Sep. 3, 1999

(30) Foreign Application Priority Data

Feb. 26, 1999 (JP) .................................................. 11-050268

(51) Int. Cl.[7] .................................................. H01L 21/00
(52) U.S. Cl. .................................................. 438/24; 438/22
(58) Field of Search .......................................... 438/22, 24

(56) References Cited

U.S. PATENT DOCUMENTS

| 4,719,501 | 1/1988 | Toshiyuki et al. |
| 5,336,623 | * 8/1994 | Sichanugrist et al. |
| 5,456,762 | * 10/1995 | Kariya et al. ........................ 136/258 |
| 5,580,820 | 12/1996 | Yamazaki . |
| 5,968,274 | * 10/1999 | Fujioka et al. ........................ 118/718 |

FOREIGN PATENT DOCUMENTS

| 0 079 190 | 5/1983 | (EP) . |
| 0 534 425 | 3/1993 | (EP) . |
| 0 827 213 | 3/1998 | (EP) . |

* cited by examiner

Primary Examiner—Long Pham
(74) Attorney, Agent, or Firm—Hogan & Hartson, LLP

(57) ABSTRACT

A p type semiconductor layer, an i type amorphous photoelectric conversion layer and an n type semiconductor layer of an amorphous type photoelectric conversion unit are formed in separate deposition chambers, respectively. A p type semiconductor layer, an i type crystalline photoelectric conversion layer and an n type semiconductor layer of crystalline type photoelectric conversion unit are formed continuously in one deposition chamber. Accordingly, a method of manufacturing a tandem type thin film photoelectric conversion device is obtained by which a tandem type thin film photoelectric conversion device having superior performance and high quality can be formed by a simple apparatus at a low cost with superior productivity.

4 Claims, 11 Drawing Sheets

METHOD OF MANUFACTURING TANDEM TYPE THIN FILM PHOTOELECTRIC CONVERSION DEVICE

BACKGROUND OF THE INVENTION

1. Field of the Invention

The present invention relates to a method of manufacturing a tandem type thin film photoelectric conversion device and, more specifically, to a method of manufacturing a thin film photoelectric conversion device of superior performance and improving production cost and efficiency.

In the specification, the terms "polycrystalline", "microcrystalline" and "crystalline" refer not only to perfect crystalline state but also a state partially involving amorphous state.

2. Description of the Background Art

In recent years a photoelectric conversion device employing a thin film containing crystalline silicon such as polycrystalline silicon, microcrystalline silicon, has been increasingly developed. It has been developed in attempting to reduce the cost of the photoelectric conversion device and also enhance the performance of the same by forming a crystalline silicon thin film of good quality on an inexpensive substrate through a process at a low temperature, and such development is expected to be applied to a variety of photoelectric conversion devices, such as optical sensors other than solar cells.

Figure 10:
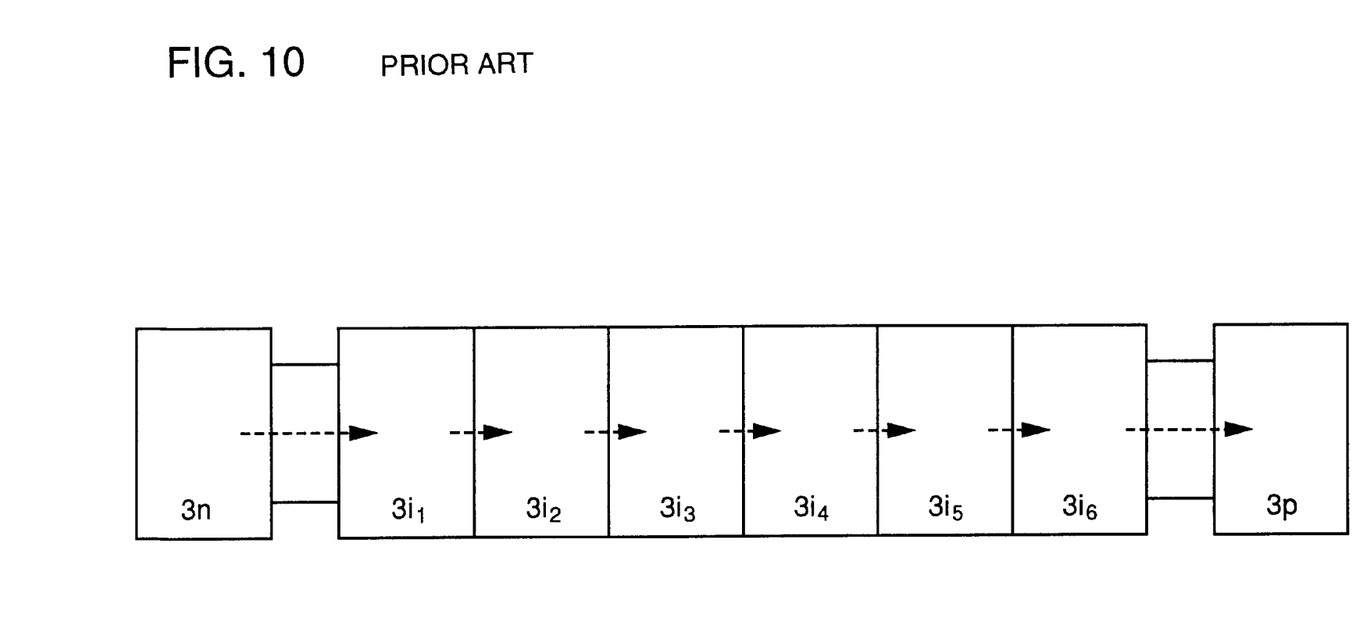
FIG. 10 is an illustration representing a method of manufacturing a thin film photoelectric conversion device in accordance with the conventional in-line system.
Figure 11:
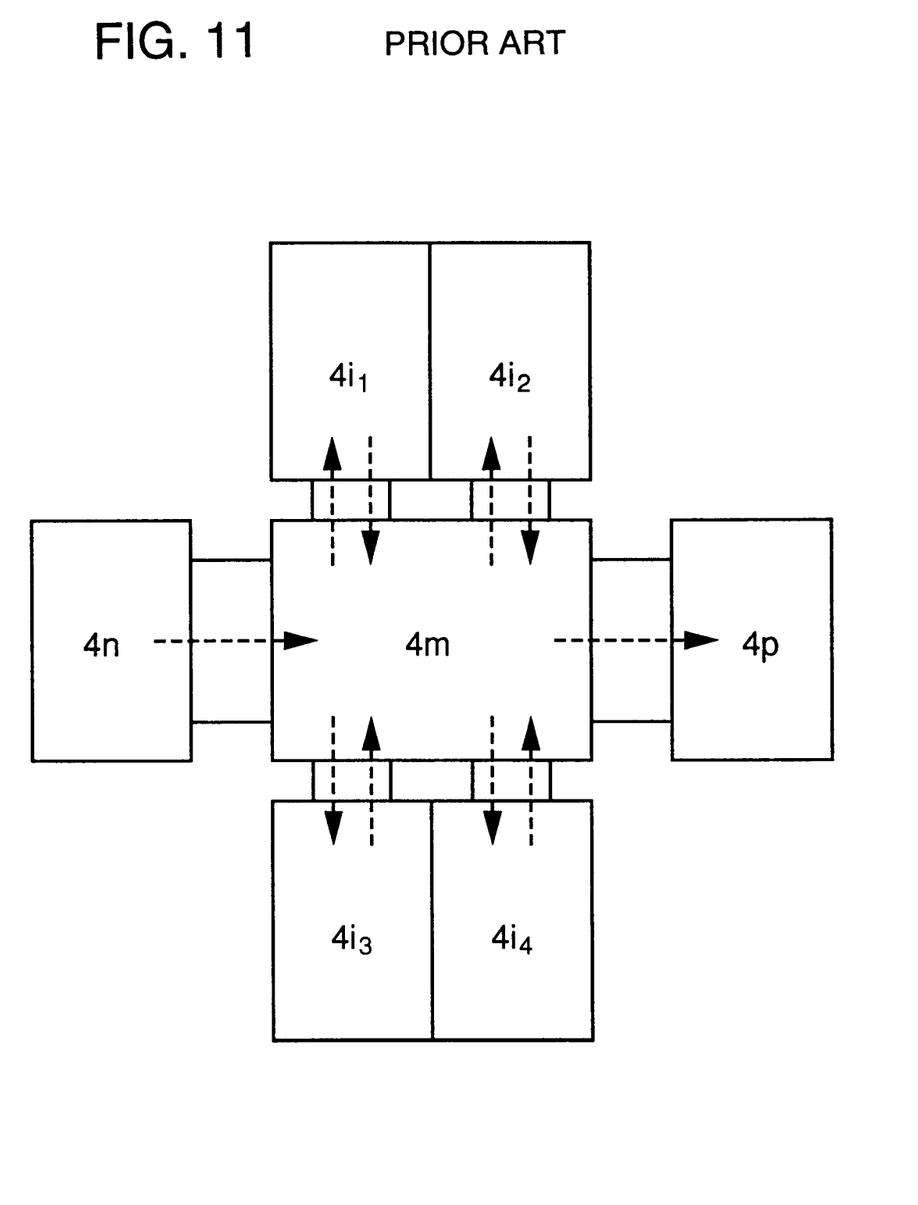
FIG. 11 is an illustration representing a method of manufacturing a thin film photoelectric conversion device in accordance with the conventional multi-chamber system.

Conventionally, as an apparatus for producing a solar cell, an in-line system apparatus in which a plurality of film deposition chambers (or simply referred to as chambers) are coupled in line as shown in the block diagram of FIG. 10, or a multi-chamber system apparatus in which a plurality of deposition chambers are arranged around a central middle chamber, as shown in the block diagram of FIG. 11, has been employed.

For an amorphous silicon solar cell, a single chamber system in which all semiconductor layers are formed in one and the same deposition chamber has been used as a simple method. In order to prevent conductivity-type determining impurity atoms doped in a p type semiconductor layer and an n type semiconductor layer from being undesirably mixed to a semiconductor layer of a different type, however, it is necessary to sufficiently replace gas in the deposition chamber before forming respective semiconductor layers, for example, by gas replacement for one hour using purge gas, such as hydrogen. Even when such a gas replacement process is performed, it has been impossible to attain superior performance of the amorphous silicon solar cell. Therefore, the single chamber system has been used only for experimental purpose.

Manufacturing of an nip type solar cell by successively depositing an n type semiconductor layer, an i type photoelectric conversion layer and a p type semiconductor layer in this order from the side of the substrate using the aforementioned in-line or multi-chamber system will be described in the following.

In the in-line system shown in FIG. 10, a structure is used in which an n layer deposition chamber $3n$ for forming the n type semiconductor layer, i layer deposition chambers $3i_1$ to $3i_6$ for forming the i type photoelectric conversion layer and a p layer deposition chamber $3p$ for forming the p type semiconductor layer are coupled in order. Here, as the n type semiconductor layer and the p type semiconductor layer are thinner than the i type photoelectric conversion layer, film deposition time for these layers is significantly shorter. For this reason, in order to improve production efficiency, a plurality of i layer deposition chambers are generally coupled, and until the film deposition time of the n and p type semiconductor layers attain a rate regulating state, the larger the number of i layer deposition chambers, the higher the productivity.

In the multi-chamber system shown in FIG. 11, a substrate on which films are to be deposited is moved to respective deposition chambers $4n$, $4i_1$ to $4i_4$ and $4p$ through a middle chamber $4m$. The in-line system shown in FIG. 10 disadvantageously includes a plurality of i layer deposition chambers $3i_1$ to $3i_6$ which require maintenance most. Further, when a tandem type thin film photoelectric conversion device such as described above is to be manufactured, it is necessary to further increase the number of deposition chambers to be coupled to each other. Accordingly, when maintenance of only one i layer deposition chamber is required, it is necessary to stop the entire production line.

By contrast, in the multi-chamber system shown in FIG. 11, a movable partition capable of maintaining air-tightness between each of the deposition chambers $4n$, $4i_1$ to $4i_4$ and $4p$ with the middle chamber $4m$ is provided. Therefore, even when there is a failure in one deposition chamber, other deposition chambers are available, and therefore overall production halt can be avoided.

The multi-chamber production system, however, has a mechanism for moving the substrate between each of the deposition chambers $4n$, $4i_1$ to $4i_4$ and $4p$ and middle chamber $4m$ while maintaining air-tightness which is complicated and expensive, and further, the number of deposition chambers arranged around middle chamber $4m$ is limited by space. Therefore, the production apparatus of this type is not widely used for actual production. Further, for manufacturing the tandem type thin film photoelectric conversion device described above, the problem of spatial restriction mentioned above is felt more seriously.

SUMMARY OF THE INVENTION

The present invention was made in order to solve the above described problems, and its object is to provide a method of manufacturing a tandem type thin film photoelectric conversion device capable of manufacturing a photoelectric conversion device having superior performance and high quality at a low cost with high efficiency, using a simple apparatus.

The method of manufacturing a tandem type thin film photoelectric conversion device in accordance with the present invention is for manufacturing a device including an amorphous type photoelectric conversion unit and a crystalline type photoelectric conversion unit stacked on one another, in which a p type semiconductor layer, an i type amorphous silicon-based photoelectric conversion layer and an n type semiconductor layer for the amorphous type photoelectric conversion unit are formed in different plasma CVD reaction chambers respectively, while a p type semiconductor layer, an i type crystalline silicon-based photoelectric conversion layer and an n type semiconductor layer of the crystalline type photoelectric conversion unit are formed in one plasma CVD reaction chamber.

In the method of manufacturing a tandem type thin film photoelectric conversion device in accordance with the present invention, when the crystalline type photoelectric conversion unit is formed, the single chamber method in which the p, i and n layers are formed in one reaction chamber is utilized, and therefore the structure of the apparatus can be simplified in this portion.

Though the single chamber method is used, tact time can significantly be reduced and a photoelectric conversion unit having superior quality and high performance can be obtained if the p, i and n layers of the crystalline type photoelectric conversion unit are formed in a prescribed order under a prescribed condition.

In the method of manufacturing a tandem type thin film photoelectric conversion device described above, preferably, the p type semiconductor layer, the i type crystalline silicon-based photoelectric conversion layer and the n type semiconductor layer of the crystalline type photoelectric conversion unit are formed in turn continuously in one reaction chamber, and the p type semiconductor layer is formed under the condition that pressure in the reaction chamber is at least 5 Torr.

The inventors have found that when p, i and n layers are formed in this order in one reaction chamber and the pressure in the reaction chamber when the p type semiconductor layer is formed is set as high as 5 Torr or higher, a photoelectric conversion device having superior quality and high performance can be obtained. Details are as follows.

As the p, i and n layers are formed in this order, mixing of the conductivity-type determining impurity atoms into the i type photoelectric conversion layer is reduced than when n, i and p layers are formed in this order. This is because the p type impurity atoms (for example, boron atoms) are harder to be diffused as compared with n type impurity atoms (for example, phosphorus atoms). More specifically, the p type impurity atoms adhered on an inner wall surface of the reaction chamber or on a plasma discharge electrode while forming the p type semiconductor layer do diffuse into the i type photoelectric conversion layer when the i type photoelectric conversion layer is formed. The extent of diffusion, however, is smaller than the n type impurity atoms. Therefore, mixing or entrance to the i type photoelectric conversion layer is suppressed.

Further, as the p type semiconductor layer is formed under a high pressure condition of 5 Torr or higher, film deposition rate of the p type semiconductor layer is high, and therefore it becomes possible to complete formation of the p type semiconductor layer in a short period of time. Accordingly, the time necessary for introducing a raw material gas for forming the p type semiconductor layer into the reaction chamber can be shortened, and hence accumulation of p type impurity atom adhered on the electrode of the reaction chamber, for example, can be suppressed. This further suppresses mixture or entrance of p type impurity atoms into the i type photoelectric conversion layer.

From the foregoing, even when the photoelectric conversion device is manufactured by the single chamber system, mixture of the conductivity-type determining impurity atoms into the i type photoelectric conversion layer can be suppressed to a large extent. Therefore, a photoelectric conversion device of superior quality and performance comparable to the photoelectric conversion device manufactured through the in-line system or the multi-chamber system can be obtained.

Further, as the device can be manufactured by the single chamber system, the facility can be simplified as compared with the in-line system or the multi-chamber system.

Further, as formation of the p type semiconductor layer can be completed in a short period of time, the tact time for manufacturing can be significantly reduced, which, together with the simplified facility, reduces the manufacturing cost.

In the method of manufacturing a tandem type thin film photoelectric conversion device described above, preferably, after either one of the amorphous type photoelectric conversion unit and the crystalline type photoelectric conversion unit is formed in a first film forming apparatus, the unit is taken out to ambient atmosphere and, thereafter, the other one of the amorphous type photoelectric conversion unit and the crystalline type photoelectric conversion unit is formed in a second film forming apparatus.

As the crystalline type and amorphous type photoelectric conversion units are formed in different film forming apparatuses respectively and exposed to ambient atmosphere when moved between film forming apparatuses, it is unnecessary to maintain vacuum in the film forming apparatus. Therefore, as compared with the conventional method in which continuous formation in vacuum is performed, the film forming apparatus can be made compact, and a production line with significantly reduced tact time can be realized.

Even when either of the photoelectric conversion units is formed and taken out to the ambient atmosphere, the performance is not significantly degraded than when the unit is formed kept in a vacuum apparatus.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures.

(First Embodiment)

The tandem type thin film photoelectric conversion device manufactured in accordance with an embodiment of the present invention will be described.

Figure 1:
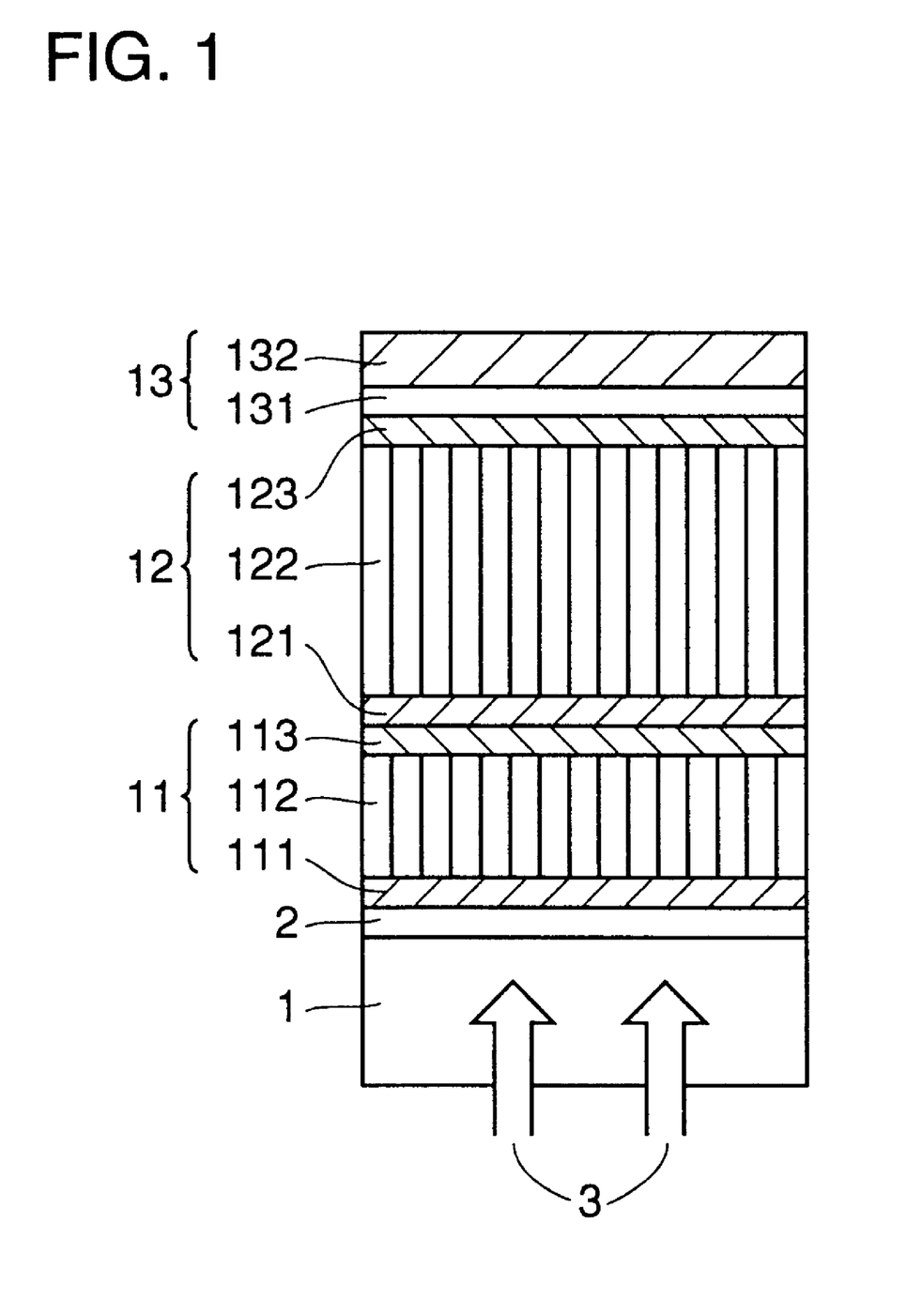
FIG. 1 is a cross sectional view schematically showing a structure of a tandem type thin film photoelectric conversion device formed by the method of manufacturing in accordance with the present invention.

Referring to FIG. 1, on a transparent substrate 1 formed, for example, of glass, a transparent conductive film 2 is formed. Transparent conductive film 2 is formed of $SnO_2$, for example. Alternatively, it may be formed of a transparent conductive oxide film such as ITO and ZnO. On transparent conductive film 2, an amorphous type photoelectric conversion unit 11 and a crystalline type photoelectric conversion unit 12 are formed stacked.

Amorphous type photoelectric conversion unit 11 has such a structure in that a p type semiconductor layer 111, an i type amorphous photoelectric conversion layer 112 and an n type semiconductor layer 113 are deposited in order. Crystalline type photoelectric conversion unit 12 has such a structure in that a p type semiconductor layer 121, an i type crystalline photoelectric conversion layer 122 and an n type semiconductor layer 12 are deposited in order.

On crystalline type photoelectric conversion unit 12, a conductive film 131 and a metal thin film 132 which will be a back side electrode portion 13, are formed. Conductive film 131 is formed of ZnO film, for example, and metal thin film 132 is formed of Ag, for example.

Light 3 is incident from the side of substrate 1 of the tandem type thin film photoelectric conversion device.

In the tandem type thin film photoelectric conversion device, light of short wavelength can be absorbed with high efficiency by the amorphous type photoelectric conversion unit, while light of long wavelength can be absorbed by the crystalline type photoelectric conversion unit, and therefore photoelectric conversion efficiency can be significantly improved.

The structure of the film forming apparatus used in the present embodiment will be described. Though not shown in FIG. 2, at least one load and/or unload chamber may be provided separately for each apparatus.

Figure 2:
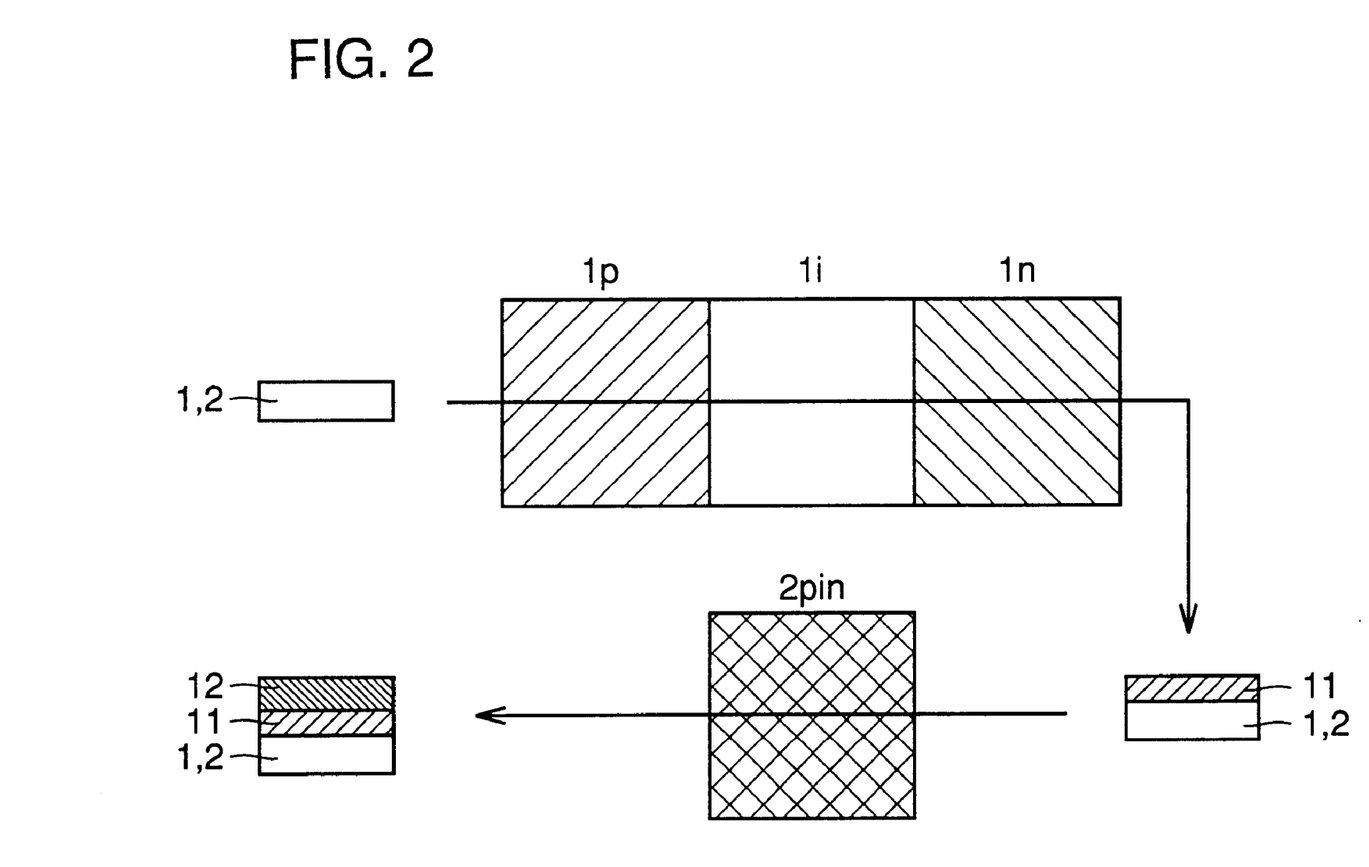
FIG. 2 is an illustration representing the method of manufacturing a tandem type thin film photoelectric conversion device in accordance with a first embodiment of the present invention.

Referring to FIG. 2, in the film forming apparatus in accordance with the present embodiment, a film forming apparatus for forming amorphous type photoelectric conversion unit 11 and a film forming apparatus for forming crystalline type photoelectric conversion unit 12 are provided separately. The film forming apparatus for forming amorphous type photoelectric conversion unit 11 has such a structure in that a p layer deposition chamber 1p for forming p type semiconductor layer 111, an i layer deposition chamber 1i for forming i type amorphous photoelectric conversion layer 112 and an n layer deposition chamber 1n for forming n type semiconductor layer 113 are coupled in order. The film forming apparatus for forming crystalline type photoelectric conversion unit 12 consists of a single deposition chamber 2pin, employing the single chamber system in which p type semiconductor layer 121, i type crystalline photoelectric conversion layer 122 and n type semiconductor layer 123 are continuously formed in one deposition chamber 2pin.

The method of manufacturing a tandem type thin film photoelectric conversion device in accordance with the present embodiment will be described in the following.

Referring to FIGS. 1 and 2, first, transparent conductive film 2 is formed on substrate 1 by vacuum evaporation method or sputtering, for example. Glass or the like which is inexpensive and has low melting point may be used as substrate 1. A transparent conductive oxide film formed of at least one oxide selected from the group consisting of ITO, $SnO_2$ and ZnO may be used as transparent conductive film 2.

In this state, by the film forming apparatus for forming amorphous type photoelectric conversion unit 11, p type semiconductor layer 111, i type amorphous photoelectric conversion layer 112 and n type semiconductor layer 113 are formed in respective deposition chambers 1p, 1i and 1n by plasma CVD method. The p type semiconductor layer 111 is formed to the thickness of 15 nm with the film deposition time of 5 minutes, i type amorphous photoelectric conversion layer 112 is formed to the thickness of 350 nm with the film deposition time of 20 minutes, and n type semiconductor layer 113 is formed to the thickness of 15 nm with the film deposition time of 5 minutes, respectively. Thus amorphous type photoelectric conversion unit 11 is formed on transparent conductive film 2.

Thereafter, substrate 1 is taken out from the film forming apparatus to ambient atmosphere, and thereafter, put in the film forming apparatus for forming crystalline type photoelectric conversion unit 12.

By the film forming apparatus for forming crystalline type photoelectric conversion unit 12, p type semiconductor layer 121, i type crystalline photoelectric conversion layer 122 and n type semiconductor layer 123 are formed continuously in this order in one deposition chamber 2pin. The p type semiconductor layer 121 is formed to the thickness of 15 nm with film deposition time of 5 minutes, i type crystalline photoelectric conversion layer 122 is formed to the thickness of 3 µm with the film deposition time of 60 minutes, and n type semiconductor layer 133 is formed to the thickness of 15 nm with the film deposition time of 5 minutes, respectively. Thus, on amorphous type photoelectric conversion unit 11, crystalline type photoelectric conversion unit 12 is formed.

Preferably, p type semiconductor layer 121 should be formed under pressure condition of at least 5 Torr. Further, i type crystalline photoelectric conversion layer 122 and n type semiconductor layer 123 should also be formed under the similar pressure condition as p type semiconductor layer 121.

Thereafter, on crystalline type photoelectric conversion unit 12, a conductive film 131 of ZnO, for example, and a metal thin film 132 of Ag, for example, are formed by sputtering, for example, and a back side electrode portion 13 including these two layers 131 and 132 is formed.

Thus, manufacturing of the tandem type thin film photoelectric conversion device shown in FIG. 1 is completed.

In the present embodiment, the single chamber system is employed for forming crystalline type photoelectric conversion unit 12 in which p type semiconductor layer 121, i type crystalline photoelectric conversion layer 122 and n type semiconductor layer 123 are formed in one reaction chamber 2pin, and therefore, in this portion of the film forming apparatus, the structure of the apparatus can be simplified.

Even when the single chamber system is used, tact time can significantly be reduced and a photoelectric conversion unit having superior quality and high performance can be obtained when p type semiconductor layer 121, i type crystalline photoelectric conversion layer 122 and n type semiconductor layer 123 of crystalline type photoelectric conversion unit 12 are formed in a prescribed order under a prescribed condition. Details will be described in the following.

The inventors have found that when p type semiconductor layer 121, i type crystalline photoelectric conversion layer 122 and n type semiconductor layer 123 are formed in this order in one deposition chamber 2pin with the pressure in deposition chamber 2pin when p type semiconductor layer is formed being as high as 5 Torr or higher, it is possible to obtain a photoelectric conversion device having superior quality and superior performance.

When p type semiconductor layer 121, i type crystalline photoelectric conversion layer 122 and n type semiconductor layer 123 are formed in this order, undesirable mixture of conductivity-type determining impurity atoms into i type crystalline photoelectric conversion layer 122 can be reduced than when n type semiconductor layer, i type crystalline photoelectric conversion layer and p type semiconductor layer are formed in this order. The possible reason for this may be that p type impurity atoms (for example, boron atoms) in p type semiconductor layer 121 formed before i type crystalline photoelectric conversion layer 122 are harder to be diffused than n type impurity atoms (for example, phosphorus atoms) in n type semiconductor layer 123. More specifically, though p type impurity atoms adhered on an inner wall surface of deposition chamber 2pin or on a plasma discharge electrode when p type semiconductor layer 121 is formed tend to be diffused to the side of i type crystalline photoelectric conversion layer 122 when i type crystalline photoelectric conversion layer 122 is formed, the extent of diffusion would be smaller than n type impurity atoms. Therefore, mixture or entrance into i type crystalline photoelectric conversion layer 122 is suppressed.

Further, as p type semiconductor layer 121 is formed under a high pressure of 5 Torr or higher, film deposition rate of p type semiconductor layer 121 can be improved, and therefore formation of p type semiconductor layer 121 can be completed in a short period of time. Therefore, the time necessary for introducing a raw material gas for forming p type semiconductor layer 121 to deposition chamber 2pin can be reduced, and therefore accumulation of p type impurity atoms adhered on the electrode in deposition chamber 2pin, for example, would be suppressed. This further suppresses mixture or entrance of p type impurity atoms to the i type crystalline photoelectric conversion layer.

From the foregoing, even when the photoelectric conversion device is manufactured by the single chamber method, mixture or entrance of conductivity-type determining impurity atoms to i type crystalline photoelectric conversion layer can be suppressed to a large extent, and therefore a photoelectric conversion device having superior quality and high performance comparable to a photoelectric conversion device obtained by the in-line system or the multi-chamber system can be obtained.

Further, as manufacturing by the single chamber system is possible, the facility can be simplified as compared with the in-line system or the multi-chamber system.

Further, as formation of p type semiconductor layer 121 can be completed in a short period of time, the tact time in manufacturing can significantly be reduced, which, together with the simplified facility, reduces manufacturing cost.

Further, as crystalline and amorphous type photoelectric conversion units 11 and 12 are formed by different film formation apparatuses respectively and exposed to ambient air when moved between the film forming apparatuses, it is unnecessary to maintain vacuum when the units are moved between film forming apparatuses. Therefore, as compared with the conventional example in which formation is continued in vacuum, the film forming apparatus can be made compact, and a production line which can significantly reduce the tact time is realized.

Further, after either one of the amorphous type and crystalline type photoelectric conversion units 11 and 12 is formed and taken out to the ambient atmosphere, the performance is not significantly degraded than when formed within a vacuum chamber, and therefore there is not a problem.

The film forming apparatus for forming amorphous type photoelectric conversion unit 11 need not be continuous to the film forming apparatus for forming crystalline type photoelectric conversion unit 12, and the film forming apparatus may be separate from each other. Therefore, even when any one deposition chamber requires maintenance, not the overall production line is stopped.

COMPARATIVE EXAMPLE 1

The tandem type thin film photoelectric conversion device shown in FIG. 1 may be manufactured by an in-line system separate chamber film forming apparatus. In that case, the structure of the apparatus is as shown in FIG. 3.

Figure 3:
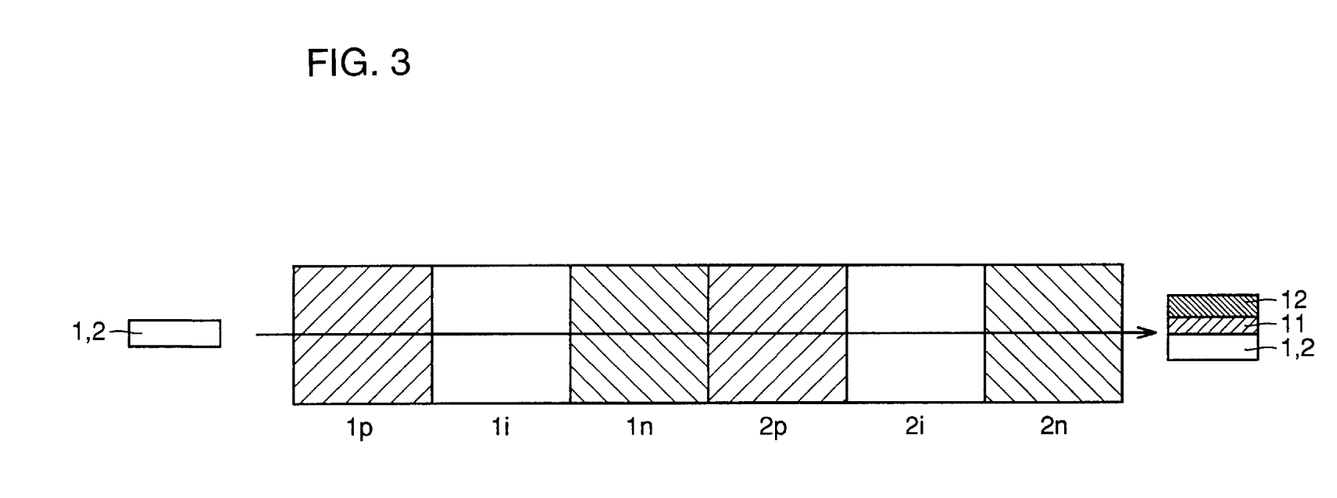
FIG. 3 is an illustration representing a method of manufacturing a tandem type thin film photoelectric conversion device of Comparative Example 1.

Referring to FIG. 3, in the in-line system separate chamber film forming apparatus, deposition chambers are coupled in a line. More specifically, a p layer deposition chamber 1p for forming p type semiconductor layer 111, an i layer deposition chamber 1i for forming i type amorphous photoelectric conversion layer 112 and an n layer deposition chamber in for forming n type semiconductor layer 113 constituting amorphous type photoelectric conversion unit 11 are coupled in order. In addition, a p layer deposition chamber 2p for forming p type semiconductor layer 121, an i layer deposition chamber 2i for forming i type crystalline photoelectric conversion layer 122 and an n layer deposition chamber 2n for forming n type semiconductor layer 123 constituting crystalline type photoelectric conversion unit 12 are coupled in order.

The method of manufacturing a tandem type thin film photoelectric conversion device using the film forming apparatus will be described in the following.

Referring to FIG. 3, first, transparent conductive film 2 is formed on substrate 1. In this state, the substrate is introduced to the in-line system separate chamber film forming apparatus.

In the film forming apparatus, p type semiconductor layer 111, i type amorphous photoelectric conversion layer 112, n type semiconductor layer 113, p type semiconductor layer 121, i type crystalline photoelectric conversion layer 122 and n type semiconductor layer 123 are formed in order in respective deposition chambers. Thus amorphous type photoelectric conversion unit 11 and crystalline type photoelectric conversion unit 12 are formed.

Thereafter, on crystalline type photoelectric conversion unit 12, conductive film 131 and metal thin film 132 are formed, and thus a back side electrode portion 13 including these two layers 131 and 132 is formed.

In the in-line system separate chamber film forming apparatus of the comparative example, as the deposition chambers are coupled, it becomes necessary to stop the overall production line, if any of the deposition chambers requires maintenance.

COMPARATIVE EXAMPLE 2

It is possible to manufacture the tandem type thin film photoelectric conversion device shown in FIG. 1 by a single wafer processing separate chamber film forming apparatus, which is in accordance with the multi-chamber system with a middle chamber. In this case, the structure of the apparatus is as shown in FIG. 4.

Figure 4:
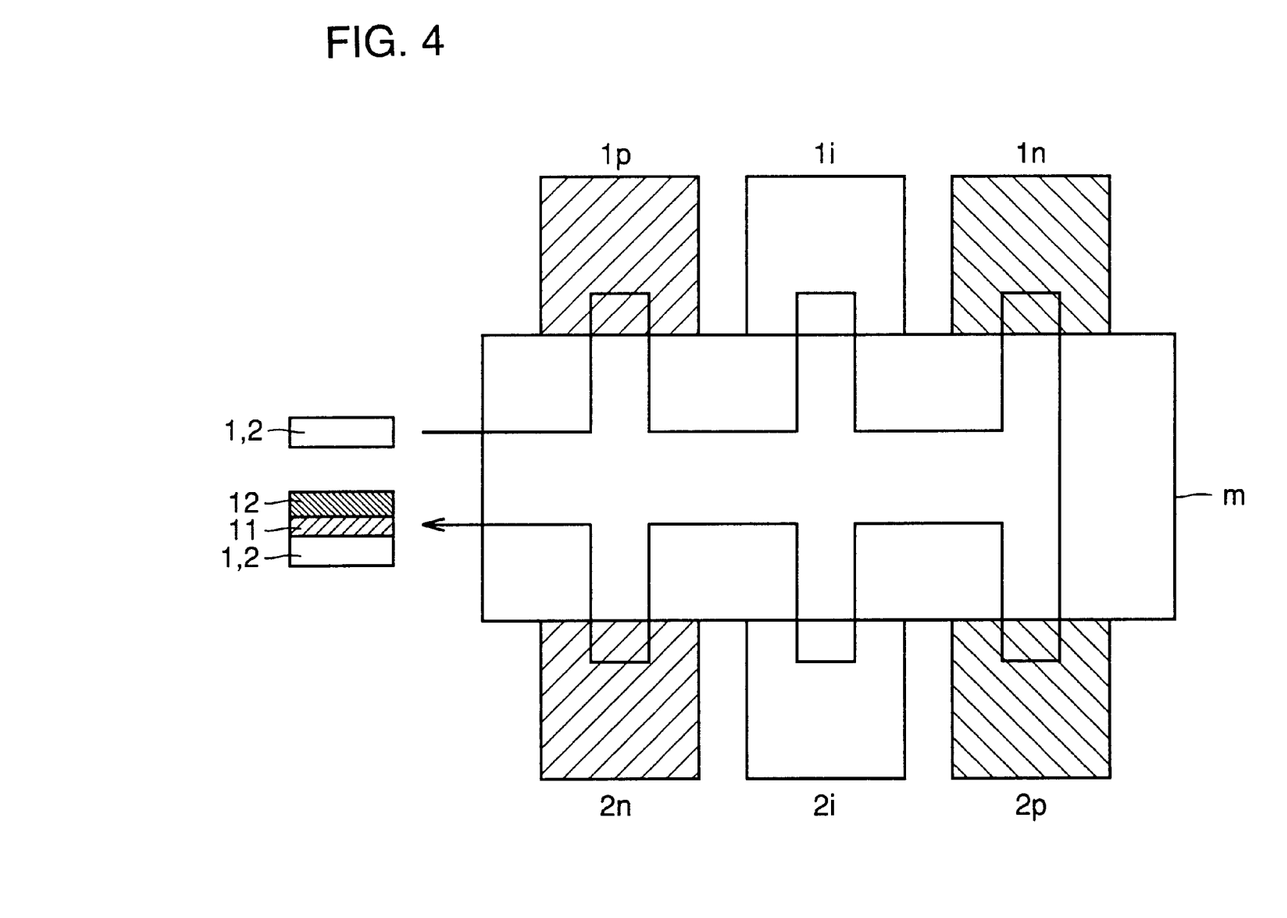
FIG. 4 is an illustration representing a method of manufacturing a tandem type thin film photoelectric conversion device of Comparative Example 2.

Referring to FIG. 4, in the single wafer type separate chamber film forming apparatus, deposition chambers are respectively connected to middle chamber m. More specifically, p layer deposition chamber 1p for forming p type semiconductor layer 111, i layer deposition chamber 1i for forming i type amorphous photoelectric conversion layer 112 and n layer deposition chamber In for forming n type semiconductor layer 113 constituting amorphous type photoelectric conversion unit 11 are connected to middle chamber m. In addition, p layer deposition chamber 2p for forming p type semiconductor layer 121, i layer deposition chamber 2i for forming i type crystalline photoelectric conversion layer 122 and n layer deposition chamber 2n for forming n type semiconductor layer 123 constituting crystalline type photoelectric conversion unit 12 are connected to middle chamber m.

The method of manufacturing a tandem type thin film photoelectric conversion device using the film forming apparatus will be described in the following.

Referring to FIG. 4, first, transparent conductive film 2 is formed on substrate 1. Thereafter, the substrate is introduced to the single wafer type separate chamber film forming apparatus.

In the film forming apparatus, the substrate is conveyed to respective deposition chambers through middle chamber m, and respective layers are formed. More specifically, p type semiconductor layer 111, i type amorphous photoelectric conversion layer 112, n type semiconductor layer 113, p type semiconductor layer 121, i type crystalline photoelectric conversion layer 122 and n type semiconductor layer 123 are formed in order. Thus, amorphous type photoelectric conversion unit 11 and crystalline type photoelectric conversion unit 12 are formed.

Thereafter, on crystalline type photoelectric conversion unit 12, conductive film 131 and metal thin film 132 are formed, and back side electrode portion 13 including these two layers 131 and 132 is formed.

In this comparative example, a movable partition maintaining air-tightness is provided between each deposition chamber and middle chamber m. Therefore, even if there is a failure in one deposition chamber, other deposition chambers are available, and therefore overall production line is not stopped. However, the mechanism for moving the substrate while maintaining air-tightness between each of the deposition chamber and middle chamber m is complicated and expensive, and the number of deposition chambers which can be arranged around middle chamber m is restricted spatially.

COMPARATIVE EXAMPLE 3

The actual manufacturing line utilizing the in-line system separate chamber film forming apparatus realizing the tact time of 5 minutes under the similar condition as the first embodiment described above is as shown in FIG. 5.

Figure 5:
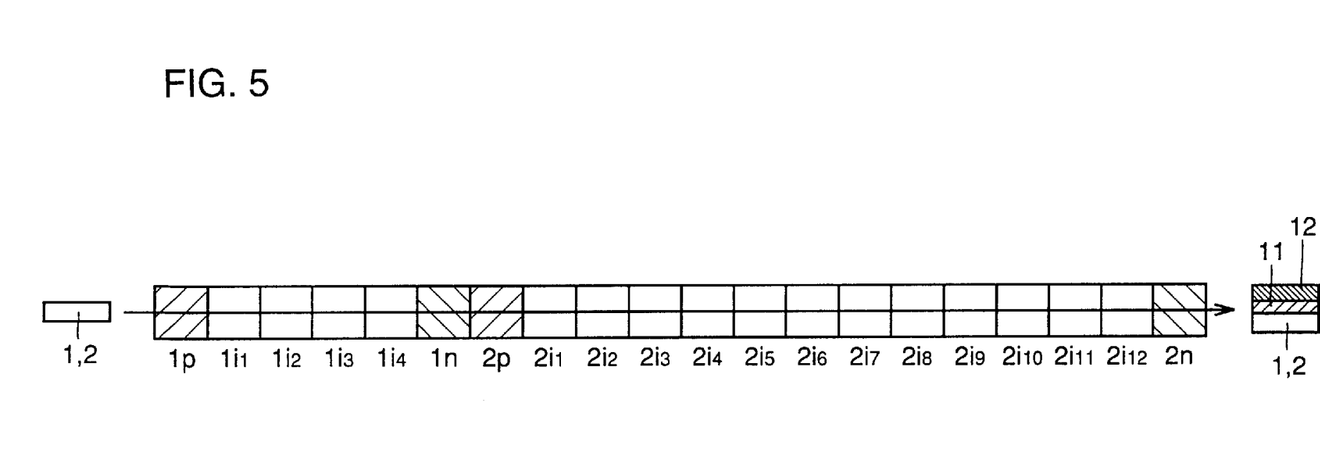
FIG. 5 is an illustration representing a method of manufacturing a tandem type thin film photoelectric conversion device of Comparative Example 3.

Referring to FIG. 5, in order to realize tact time of 5 minutes, it is necessary to set the film deposition time in each deposition chamber to 5 minutes. Here, film deposition time of i type amorphous photoelectric conversion layer 112 is 20 minutes, while film deposition time of i type crystalline photoelectric conversion layer 122 is 60 minutes. Therefore, in order to attain the film deposition time of 5 minutes in each deposition chamber, four deposition chambers (1i1 to 1i4) are necessary for forming i type amorphous photoelectric conversion layer 11 (5 minutes×4), and twelve deposition chambers (2i1 to 2i12) are necessary for forming i type crystalline photoelectric conversion layer 122 (5 minutes×12).

Therefore, the manufacturing line becomes very long, and the 30 problem that the overall manufacturing line must be stopped when any of the deposition chambers requires maintenance becomes more serious.

COMPARATIVE EXAMPLE 4

The actual manufacturing line using the single wafer type separate chamber film forming apparatus to realize the tact time of 5 minutes under the similar condition as the first embodiment described above is as shown in FIG. 6.

Figure 6:
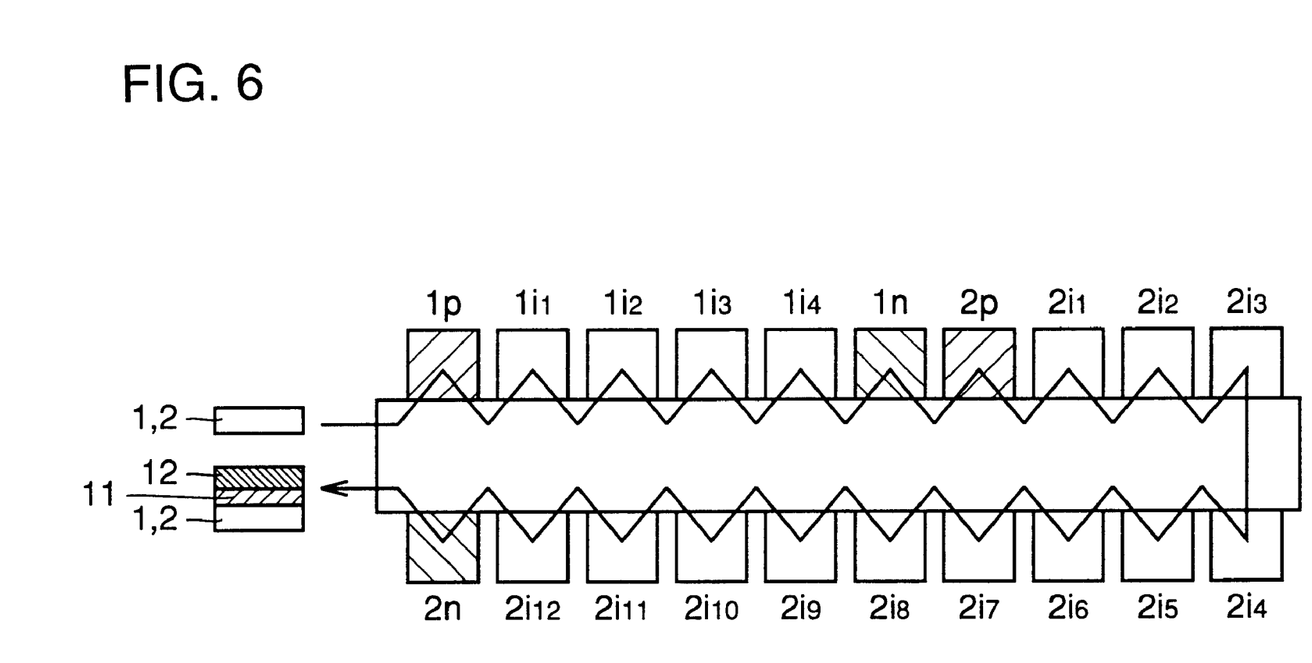
FIG. 6 is an illustration representing a method of manufacturing a tandem type thin film photoelectric conversion device of Comparative Example 4.

Referring to FIG. 6, in this comparative example also, similar to Comparative Example 3 described above, four deposition chambers 1i1 to 1i4 are necessary for forming i type amorphous photoelectric conversion layer 112 (5 minutes×4), and twelve deposition chambers (2i1 to 2i12) are necessary for forming i type crystalline photoelectric conversion layer 122 (5 minutes×12).

Therefore, the problem of complicated mechanism of the film forming apparatus itself becomes more serious, and the film forming apparatus comes to be very large in scale.

COMPARATIVE EXAMPLE 5

Figure 7:
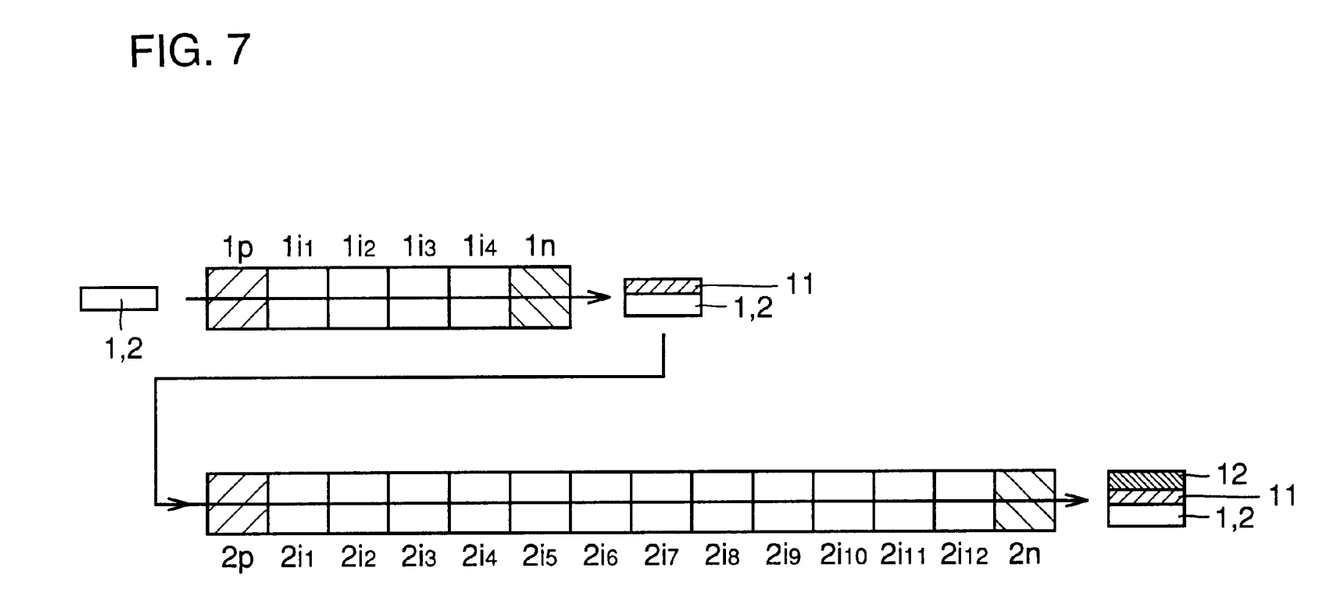
FIG. 7 is an illustration representing a method of manufacturing a tandem type thin film photoelectric conversion device of Comparative Example 5.

An actual manufacturing line for manufacturing the amorphous type photoelectric conversion unit and the crystalline type photoelectric conversion unit by separate in-line system separate chamber film forming apparatuses while realizing the tact time of 5 minutes is as shown in FIG. 7.

Referring to FIG. 7, in this case also, similar to Comparative Examples 3 and 4, four deposition chambers 1i1 to 1i4 are necessary for forming i type amorphous photoelectric conversion layer 112 (5 minutes×4), and twelve deposition chambers 2i1 to 2i12 are necessary for forming i type crystalline photoelectric conversion layer 122 (5 minutes×12). After the amorphous type photoelectric conversion unit 11 is formed, the substrate is once taken out to the ambient atmosphere from the film forming apparatus and thereafter, moved to the film forming apparatus for forming the amorphous type photoelectric conversion unit.

Here, the film forming apparatus for forming the amorphous type photoelectric conversion unit and the film forming apparatus for forming the crystalline type photoelectric conversion unit are separate from each other. Therefore, the scale of each film forming apparatus can be made smaller than in Comparative Examples 3 and 4. Nevertheless, the film forming apparatus for forming crystalline type photoelectric conversion unit 12 has the overall manufacturing line of considerable length and considerable scale.

(Second Embodiment)

Figure 8:
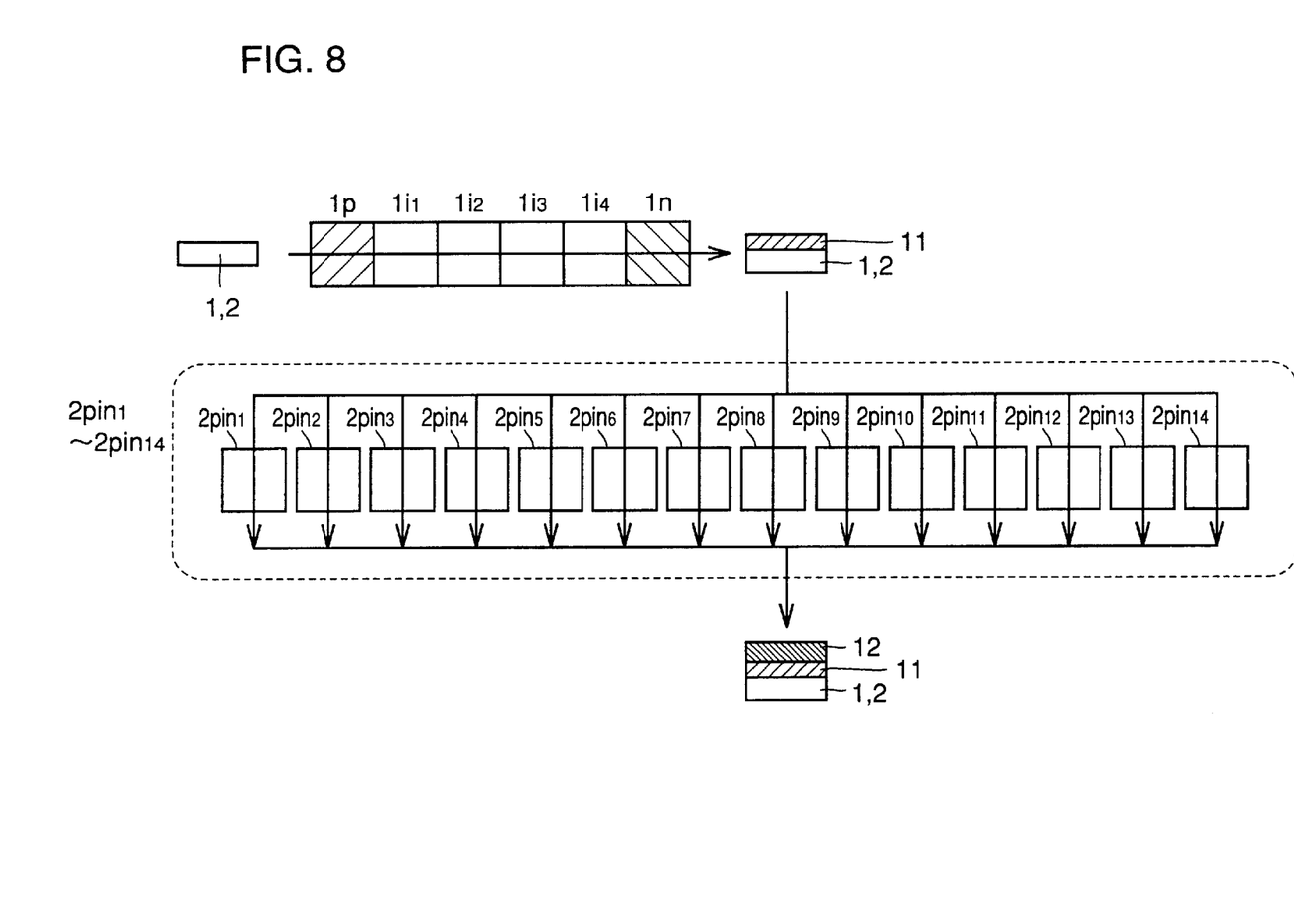
FIG. 8 is an illustration representing a method of manufacturing a tandem type thin film photoelectric conversion device in accordance with a second embodiment of the present invention.

Referring to FIG. 8, in the present embodiment, a film forming apparatus for forming amorphous type photoelectric conversion unit 11 and film forming apparatus for forming crystalline type photoelectric conversion unit 12 are separated. Further, the film forming apparatus for forming amorphous type photoelectric conversion unit 11 is of an in-line system separate chamber film forming apparatus, in which p layer deposition chamber 1p for forming p type semiconductor layer 111, four i layer deposition chambers 1i1 to 1i4 for forming i type amorphous photoelectric conversion layer 112 and n layer deposition chamber in for forming n type semiconductor layer 113 are coupled in order. The film forming apparatus for forming crystalline type photoelectric conversion unit 12 is of the single chamber system. More specifically, p type semiconductor layer 121, i type crystalline photoelectric conversion layer 122 and n type semiconductor layer 123 of the crystalline type photoelectric conversion unit 12 are continuously formed in order in one deposition chamber. Further, a plurality of film forming apparatuses of the single chamber system, for example, 12 such apparatuses (2pin1 to 2pin12) are provided.

The method of manufacturing a tandem type thin film photoelectric conversion device in accordance with the present embodiment will be described in the following.

First, on a substrate 1, a transparent conductive film 2 is formed. In this state, respective films are formed by plasma CVD method in the film forming apparatus for forming amorphous type photoelectric conversion unit 11. More specifically, p type semiconductor layer 111 is formed to the thickness of 15 nm with film deposition time of 5 minutes on transparent conductive film 2 in p layer deposition chamber 1p. Film formation with film deposition time of 5 minutes is performed in each of i layer deposition chambers 1i1 to 1i4, so that i type amorphous photoelectric conversion layer 112 having a total thickness of 350 nm is formed thereon. Further, n type semiconductor layer 113 is formed thereon to the thickness of 15 nm with the film deposition time of 5 minutes, in deposition chamber in. Thus, amorphous type photoelectric conversion unit 11 is formed.

The substrate is once taken out to the ambient atmosphere from the film forming apparatus, and respective films are formed by plasma CVD in the film forming apparatus for forming crystalline type photoelectric conversion unit 12 of single chamber system. More specifically, p type semiconductor layer 121 is formed to the thickness of 15 nm with the film deposition time of 5 minutes, i type crystalline photoelectric conversion layer 122 is formed to the thickness of 3 $\mu$m with the film deposition time of 60 minutes, and n type semiconductor layer 123 is formed to the thickness of 15 nm with the film deposition time of 5 minutes. Thus, crystalline type photoelectric conversion unit 12 is formed.

Thereafter, on crystalline type photoelectric conversion unit 12, an ZnO film 131 is formed to the thickness of 100 nm and an Ag film 132 is formed to the thickness of 300 nm, by sputtering, respectively, as back side electrode portion 13. Thus, the tandem type thin film photoelectric conversion device is completed.

In the present embodiment, the film forming apparatus for forming crystalline type photoelectric conversion unit 12 is of the single chamber system, and therefore, the scale of the apparatus can be made even smaller than the film forming apparatus of Comparative Example 5.

(Third Embodiment)

Figure 9:
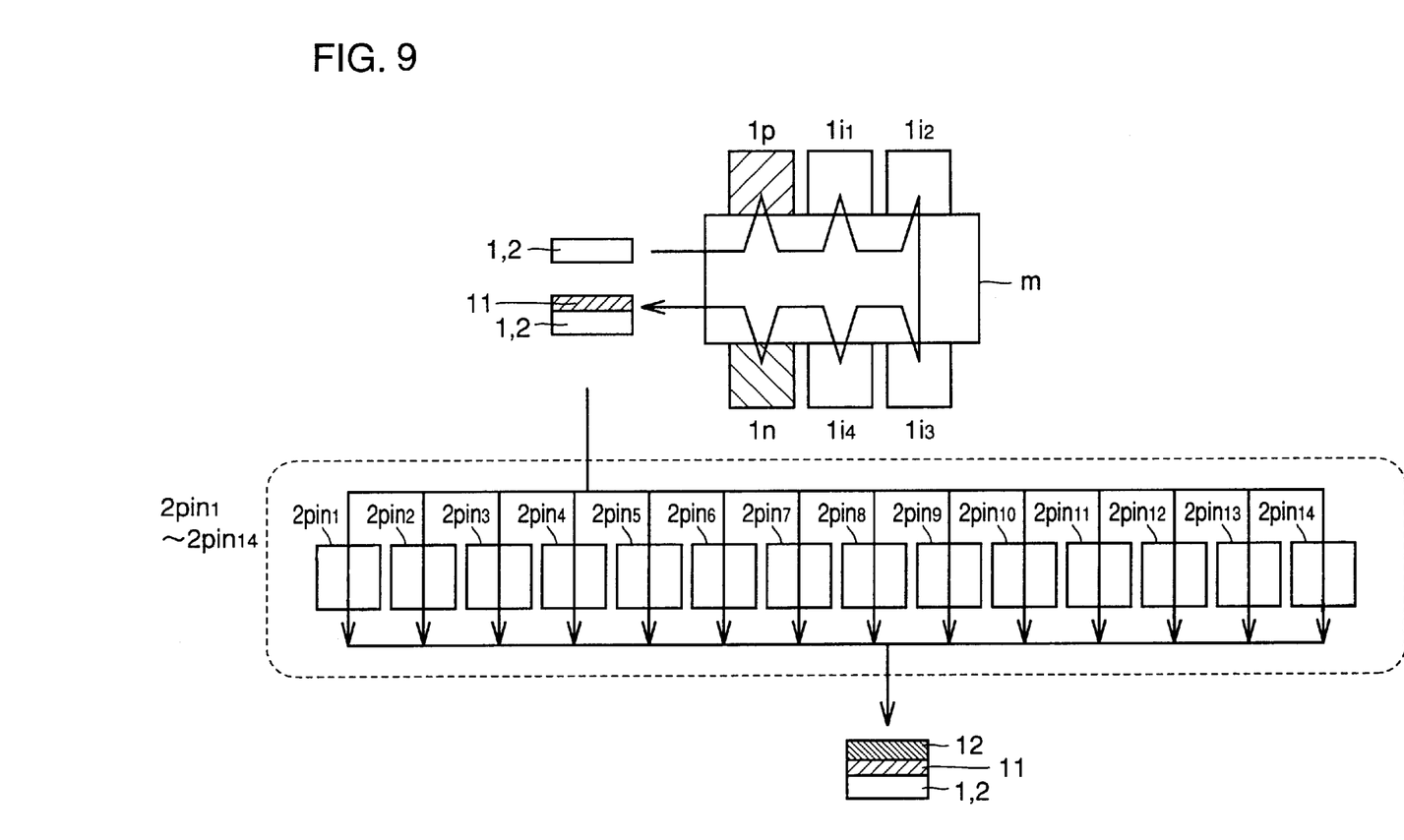
FIG. 9 is an illustration representing a method of manufacturing a tandem type thin film photoelectric conversion device in accordance with a third embodiment of the present invention.

Referring to FIG. 9, the film forming apparatus in accordance with the present invention differs from the apparatus in accordance with the second embodiment described above in the structure of the film forming apparatus for forming amorphous type photoelectric conversion unit 11.

The film forming apparatus for forming amorphous type photoelectric conversion unit 11 is of the single wafer type separate chamber film forming apparatus. More specifically, p layer deposition chamber 1p for forming p type semiconductor layer 111, four i layer deposition chambers 1i1 to 1i4 for forming i type amorphous photoelectric conversion layer 112 and n type deposition chamber in for forming n type semiconductor layer 113 are connected to a middle chamber m.

Except for this point, the structure of the film forming apparatus is similar to that of the second embodiment described above. Therefore, corresponding portions are denoted by the same reference characters and description thereof is not repeated.

The method of manufacturing a tandem type thin film photoelectric conversion device in accordance with the present embodiment will be described in the following.

First, transparent conductive film 2 is formed on substrate 1. In this state, respective layers are formed by the plasma CVD method in the film forming apparatus for forming amorphous type photoelectric conversion unit 11. More specifically, p type semiconductor layer 111 is formed to the thickness of 15 nm with the film deposition time of 5 minutes in p layer deposition chamber 1p. Film formation is performed with film deposition time of 5 minutes in each of i layer deposition chambers 1i1 to 1i4, and i type amorphous photoelectric conversion layer 112 having the total thickness of 350 nm is formed. In n layer deposition chamber in, n type semiconductor layer 113 is formed to the thickness of 15 nm with the film deposition time of 5 minutes. Thus amorphous type photoelectric conversion unit 11 is formed.

Thereafter, the substrate is once taken out to the ambient atmosphere, and thereafter, film forming process is performed in the film forming apparatus for forming crystalline type photoelectric conversion unit. The method of film formation is similar to the second embodiment, and therefore description thereof is not repeated.

Thus, crystalline type photoelectric conversion unit 12 including p type semiconductor layer 121 having the thickness of 15 nm, i type crystalline photoelectric conversion layer 122 having the thickness of 3 $\mu$m and n type semiconductor layer 123 having the thickness of 15 nm is formed.

Thereafter, in the similar manner as the second embodiment, back side electrode portion 13 is formed, and thus the tandem type thin film photoelectric conversion device is completed.

In the present embodiment, the film forming apparatus for forming crystalline type photoelectric conversion unit 12 is of the single chamber system, and therefore, the scale of the apparatus can be made even smaller than the film forming apparatus of Comparative Example 5.

In the method of manufacturing a tandem type thin film photoelectric conversion device in accordance with the present invention, for forming the crystalline type photoelectric conversion unit, single chamber system in which p, i and n layers are formed in one reaction chamber is employed, and therefore at this portion, the structure of the apparatus can be simplified.

Further, even when the single chamber system is used, the tact time can be significantly reduced and a photoelectric conversion unit having superior quality and high performance can be obtained if the p, i, and n layers of the crystalline type photoelectric conversion unit are formed in a prescribed order under a prescribed condition.

Therefore, it becomes possible to manufacture a tandem type thin film photoelectric conversion device having superior performance and high quality by a simple apparatus at low cost with high productivity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a tandem type thin film photoelectric conversion device, including an amorphous type photoelectric conversion unit and a crystalline type photoelectric conversion unit stacked on one another, wherein a p type semiconductor layer, an i type amorphous silicon-based photoelectric conversion layer and an n type semiconductor layer of said amorphous type photoelectric conversion unit are formed in different plasma CVD reaction chambers respectively, and a p type semiconductor layer, an i type crystalline silicon-based photoelectric conversion layer and an n type semiconductor layer of said crystalline type photoelectric conversion unit are formed in one plasma CVD reaction chamber.

2. The method of manufacturing a tandem type thin film photoelectric conversion device according to claim 1, wherein said p type semiconductor layer, said i type crystalline silicon-based photoelectric conversion layer and said n type semiconductor layer of said crystalline type photoelectric conversion unit are formed successively in order in said one reaction chamber, and said p type semiconductor layer of said crystalline type photoelectric conversion unit is formed under a condition that pressure in said reaction chamber is at least 5 Torr.

3. The method of manufacturing a tandem type thin film photoelectric conversion device according to claim 1, wherein one of said amorphous type photoelectric conversion unit and said crystalline type photoelectric conversion unit is formed in a first film forming apparatus, thereafter taken out to ambient atmosphere, and thereafter the other one of said amorphous type photoelectric conversion unit and said crystalline type photoelectric conversion unit is formed in a second film forming apparatus.

4. A method of manufacturing a tandem type thin film photoelectric conversion device, including an amorphous type photoelectric conversion unit and a crystalline type photoelectric conversion unit stacked on one another, wherein a p type semiconductor layer, an i type amorphous silicon-based photoelectric conversion layer and an n type semiconductor layer of said amorphous type photoelectric conversion unit are formed in different plasma CVD reaction chambers respectively, and a p type semiconductor layer, an i type crystalline silicon-based photoelectric conversion layer and an n type semiconductor layer of said crystalline type photoelectric conversion unit are formed successively in order in one plasma CVD reaction chamber, and said p type semiconductor layer of said crystalline type photoelectric conversion unit is formed under a condition that a pressure in said reaction chamber is at least 5 Torr.

* * * * *